US012260922B2

(12) United States Patent
Hirano et al.

(10) Patent No.: US 12,260,922 B2
(45) Date of Patent: Mar. 25, 2025

(54) SEMICONDUCTOR DEVICE FOR WRITING TO A STORAGE ELEMENT

(71) Applicants: TOWER PARTNERS SEMICONDUCTOR CO., LTD., Uozu (JP); TOWER SEMICONDUCTOR LTD., Migdal Haemek (IL)

(72) Inventors: Hiroshige Hirano, Nara (JP); Hiroaki Kuriyama, Toyama (JP); Masahiko Sakagami, Kyoto (JP); Micha Gutman, Haifa (IL); Erez Sarig, Kadima (IL); Yakov Roizin, Afula (IL)

(73) Assignees: TOWER PARTNERS SEMICONDUCTOR CO., LTD., Uozu (JP); TOWER SEMICONDUCTOR LTD., Migdal Haemek (IL)

( * ) Notice: Subject to any disclaimer, the term of this patent is extended or adjusted under 35 U.S.C. 154(b) by 135 days.

(21) Appl. No.: 18/121,466

(22) Filed: Mar. 14, 2023

(65) Prior Publication Data

US 2023/0238070 A1    Jul. 27, 2023

Related U.S. Application Data

(63) Continuation of application No. PCT/JP2020/035503, filed on Sep. 18, 2020.

(51) Int. Cl.
*G11C 17/00* (2006.01)
*G11C 17/16* (2006.01)
*G11C 17/18* (2006.01)

(52) U.S. Cl.
CPC .............. *G11C 17/18* (2013.01); *G11C 17/16* (2013.01)

(58) Field of Classification Search
CPC ........... G11C 17/18; G11C 17/16; G11C 7/02; G11C 7/22

(Continued)

(56) References Cited

U.S. PATENT DOCUMENTS 5,457,649 A * 10/1995 Eichman ............. H01L 23/5256
365/182
5,668,751 A    9/1997 Sher et al.
(Continued)

FOREIGN PATENT DOCUMENTS

JP    H05-206810 A    8/1993
JP    2006-155710 A    6/2006
(Continued)

OTHER PUBLICATIONS

JP Office Action dated Aug. 31, 2021 as received in Application No. 2019-055432.
(Continued)

*Primary Examiner* — Tha-O H Bui
(74) *Attorney, Agent, or Firm* — Maschoff Brennan

(57) ABSTRACT

A semiconductor device includes a storage element write unit including a storage element configured to be electrically written only once and store two values, a write controller connected to the storage element through a first node signal and configured to perform a write to the storage element based on a write control signal instructing a write to the storage element, and a write state detection circuit configured to detect that the storage element is in a write state based on a measurement signal obtained by measuring the first node signal. In a case where the write controller receives a detection signal indicating that the storage element is in the write state from the write state detection circuit after start of a write to the storage element, the write (Continued)

controller stops write operation after a lapse of a predetermined time from detection of the write state of the storage element.

17 Claims, 15 Drawing Sheets

(58) Field of Classification Search
USPC .......................................................... 365/96
See application file for complete search history.

(56) References Cited

U.S. PATENT DOCUMENTS

| | | | | |
|---|---|---|---|---|
| 5,691,946 | A * | 11/1997 | DeBrosse | G11C 29/80 365/63 |
| 7,405,989 | B2 * | 7/2008 | Chung | G11C 17/16 257/E23.149 |
| 8,223,575 | B2 | 7/2012 | Lin et al. | |
| 8,427,857 | B2 * | 4/2013 | Chen | G11C 17/16 257/209 |
| 8,514,638 | B2 * | 8/2013 | Koyashiki | G11C 17/18 365/185.21 |
| 2006/0114708 | A1 | 6/2006 | Shirahama et al. | |
| 2006/0152990 | A1 | 7/2006 | Huang | |
| 2006/0158923 | A1 | 7/2006 | Namekawa et al. | |
| 2008/0136496 | A1 | 6/2008 | He et al. | |
| 2008/0251887 | A1 | 10/2008 | Lee | |
| 2011/0273949 | A1 | 11/2011 | Chen et al. | |
| 2012/0120750 | A1 | 5/2012 | Kubouchi et al. | |
| 2012/0213014 | A1 | 8/2012 | Koyashiki et al. | |
| 2013/0286710 | A1 | 10/2013 | Hall et al. | |

FOREIGN PATENT DOCUMENTS

| | | |
|---|---|---|
| JP | 2006-196079 A | 7/2006 |
| JP | 2008-250207 A | 10/2008 |
| JP | 2012-109329 A | 6/2012 |
| JP | 2012-174284 A | 9/2012 |
| JP | 2020-155193 A | 9/2020 |

* cited by examiner

SEMICONDUCTOR DEVICE FOR WRITING TO A STORAGE ELEMENT

CROSS-REFERENCE TO RELATED APPLICATIONS

This is a continuation of International Application No. PCT/JP2020/035503 filed on Sep. 18, 2020. The entire disclosure of this application is incorporated by reference herein.

TECHNICAL FIELD

The present disclosure relates to a semiconductor device, and particularly to a semiconductor device configured to perform a write to a storage element that is electrically written only once.

BACKGROUND ART

The semiconductor storage element is an important element for storing a value unique to each operation. An electrical fuse has been widely used as a semiconductor storage element that can be used for easily setting a value even after production for commercialization.

Patent Document 1, for example, describes a write control circuit that controls a write to an electrical fuse as a storage element and a semiconductor device. Specifically, when a transistor is turned on in response to a write signal, a current flows in the electrical fuse to blow the electrical fuse so that the electrical fuse (storage element) becomes a write state.

Patent Document 2 shows that an electrical fuse is blown in response to a write signal in a manner similar to Patent Document 1, but the electrical fuse is not completely blown and sets and stores different resistance values as a plurality of blown states based on a signal specifying a write state. Specifically, in Patent Document 2, a blown condition of the electrical fuse is monitored, and the blown state is stopped immediately after the electrical fuse is determined to have a desired resistance value, and the resistance value is maintained. That is, in Patent Document 2, determination is made based on one of a plurality of determination values so that the blown state (write state) is immediately stopped, and blown states are set to store multiple values. The technique of Patent Document 2 is different in situation of application from the technique of the present disclosure using a completely blown state.

CITATION LIST

Patent Document

Patent Document 1: Japanese Patent Application Publication No. 2012-174284
Patent Document 2: U.S. Pat. No. 8,223,575

SUMMARY OF THE INVENTION

Technical Problem

The electrical fuse is blown by causing a large current to flow in the fuse, for example, by turning on a transistor that is a write driver for causing a current to flow in a fuse. The blown state is changeable depending on machining result of the fuse, current driving capacity of a write driver affecting a current flowing in the fuse, and a turn-on period of the write driver. In regard to the turn-on period of the write driver, some fuses are blown in a short turn-on period, and other fuses are blown in a long turn-on period. If the turn-on period of the write driver is fixed, some fuses cannot be sufficiently blown, or a fuse that is blown in a short period is subjected to long-term application of an electric field so that a metal material of the temporarily blown fuse moves to reconnect the fuse, resulting in occurrence of leakage, disadvantageously. These blown times vary depending on various causes such as temperature as well as current and voltage.

Even when the turn-on period of a transistor is adjusted to be fixed with a known technique as described in Patent Document 1, it is difficult to obtain stable write operation in some cases, and stable blowing of an electrical fuse is inhibited, resulting in the possibility of decrease in initial blowing yield of the electrical fuse and degradation of reliability.

FIG. 18 is a view for describing problems in a configuration similar to that of Patent Document 1. In FIG. 18, reference character 81 denotes a fuse as a storage element, reference character 82 denotes a write controller, and the write controller 82 is constituted by a write driver 83 of a transistor and a write driver controller 84. The fuse 81 and the write driver 83 are connected to each other through a node signal N81. An output node signal N82 of the write driver controller 84 is connected to the gate of the transistor of the write driver 83. The write driver controller 84 receives a control signal CT81 from the outside to be controlled.

In the configuration illustrated in FIG. 18, even after the fuse 81 is blown at time T21 and is determined to be in the blown state, a stress voltage continues to be applied to the fuse 81. Then, a metal portion, for example, of the temporarily blown fuse might be reconnected (time T81 in FIG. 19). When such reconnection changes a fuse resistance to be a resistance value in an insufficiently blown state, the problem of an erroneous determination as an unblown state can occur in reading. When the fuse temporarily has an intermediate resistance value, a small current flows and less heat is generated so that the fuse will never be blown in some cases. Thus, in addition to the decrease in initial blowing yield described above, there arises the possibility of a failure in a reliability test of, for example, voltage application at high temperature for a long period in actual application.

Although Patent Document 2 is directed to an application situation different from a situation using a completely blown state as described in the technique of the present disclosure, Patent Document 2 employs a configuration in which a blown state is stopped immediately after an electrical fuse is determined to be a desired resistance value, and the resistance value is maintained. In FIG. 3 of Patent Document 2, the configuration of a fuse and a write driver is the same as the known example of FIG. 18. This configuration, however, has two operational concerns. A first concern is the possibility of erroneous determination that the fuse is in a blown state because of an excessively low potential of the node signal N81 due to an undershoot when the write driver 83 turns on and starts blowing at time T20 in FIG. 19. A second concern is the possibility that when a fuse is slightly blown at time T21, an undershoot of a potential of the node signal N81 also occurs. Accordingly, the potential of the node signal N81 decreases below the stable state thereof, and even in a case where the fuse has not been sufficiently blown yet, the fuse might be erroneously determined to be sufficiently blown. The circuit configuration of Patent Document 2 has the problem that the write driver 83 is immediately stopped based on the erroneously determined signal, and consequently, the fuse is insufficiently blown. If the circuit is configured with a slightly smaller determination value in anticipation of the undershoot in order to avoid the problem, determination of a blown state cannot be made without occurrence of an undershoot. In any case, the configuration in which the blown state is stopped immediately after determination of the blown state cannot provide correct determination in some cases, and a correct complete blown state cannot be obtained.

It is therefore an object of the present disclosure to obtain stable write operation to a storage element that is electrically written only once in a semiconductor device.

Solution to Problem

A semiconductor device according to a first aspect of the present disclosure includes a storage element write unit. The storage element write unit is constituted by a storage element and a write controller, the storage element being configured to be electrically written only once, the write controller being configured to perform a write to the storage element, the write controller is controlled based on a write control signal, and is constituted by a write driver, a write driver controller, and a write state detection circuit, the storage element and the write driver are connected to each other through a first node signal between a power supply voltage source and a ground voltage source, a second node signal that is an output from the write driver controller is input to the write driver, the write state detection circuit outputs a third node signal as a detection signal, the third node signal being input to the write driver controller, the write state detection circuit includes a signal level detection circuit, the first node signal being input to the signal level detection circuit, the signal level detection circuit being configured to output a fourth node signal, the third node signal being output as an output from the fourth node signal, and in a case where a blown state of the storage element is detected based on the first node signal for detecting a write state of the storage element after start of a write to the storage element, write operation to the storage element is stopped after a lapse of a predetermined time from detection of the blown state.

The "stop" herein refers to stopping a write driver in a case where a write (blowing) to a storage element has started by a write controller.

In this aspect, the write state to the storage element is stopped after a lapse of the predetermined time after detection of the blown state of the storage element. Thus, the blown state can be stable, and the semiconductor device is allowed to have a high yield and high reliability.

The semiconductor device according to a second aspect of the present disclosure may further include a delay circuit configured to set the predetermined time in at least one of the write driver controller or the write state detection circuit, in the semiconductor divide of the first aspect.

The presence of the delay circuit in this aspect enables a more stable write state.

In the semiconductor device according to a third aspect of the present disclosure, the write state detection circuit may include a first determination circuit configured to determine that the storage element is in the write state based on a write control signal instructing a write to the storage element and the first node signal, and a second determination circuit configured to determine that the storage element is in the write state based on the first node signal and a signal based on a node signal as a determination output from the first determination circuit, in the semiconductor divide of the first aspect.

In this aspect, the method of determining multiple time is employed, and a state where the first node signal is stable can be determined. Thus, a more stable write state can be set.

In the semiconductor device according to a fourth aspect of the present disclosure, the signal level detection circuit may be capable of detecting at least a first signal potential and a second signal potential, may detect the second signal potential after a lapse of the predetermined time from detection of the first signal potential, and may output the third node signal based on detection of the second signal potential, in the semiconductor divide of the first aspect.

In this aspect, since the second signal potential is detected after a lapse of the predetermined time, the first node signal can be detected in a stable state, and a more stable write state can be obtained.

In the semiconductor device according to a fifth aspect of the present disclosure, the write driver may be a transistor, and the write driver controller may be configured to drive a gate of the transistor to an on-state and have a driving capacity less than or equal to $1/10$ of a driving capacity of the write driver, in the semiconductor divide of the first aspect.

In this aspect, an undershoot of the first node signal at start of blowing, for example, is reduced, erroneous determination is less likely to occur, and more stable write determination can be made.

In the semiconductor device according to a sixth aspect of the present disclosure, the write driver may include at least a first driver and a second driver, the write driver controller may include a first driver control circuit configured to drive the first driver and a second driver control circuit configured to drive the second driver, and the second driver control circuit may control driving after a lapse of a predetermined delay time from driving control by the first driver control circuit, in the semiconductor divide of the first aspect.

In this aspect, an undershoot of the first node signal at start of blowing, for example, is reduced, erroneous determination is less likely to occur, and more stable write determination can be made.

In the semiconductor device according to a seventh aspect of the present disclosure, the signal level detection circuit may be capable of detecting at least a first signal potential and a third signal potential, detection of the first signal potential may be to detect a write state to the storage element, and detection of the third signal potential may be to detect determination in reading, in the semiconductor divide of the first aspect.

In this aspect, the circuit for determining a blown state of the fuse is shared so that the circuit area can be thereby reduced.

In the semiconductor device according to an eighth aspect of the present disclosure, the storage element write unit may include a plurality of storage element write units, the semiconductor device may further include an overall control circuit configured to control the plurality of storage element write units, each of the plurality of storage element write units may include a latch circuit configured to store information on whether to perform a write to the storage element write unit or not, and each of the plurality of storage element write units may perform write operation based on a write control signal instructing the write and information of the latch circuit, in the semiconductor divide of the first aspect.

In this aspect, information of performing a write is latched only to one unit and information of performing a write is not latched to the other units, and a write is performed for each block. This configuration ensures obtaining of a current necessary for performing a write to the storage element so that the fuse can be blown with stability.

In the semiconductor device according to a ninth aspect of the present disclosure, the storage element write unit may include a plurality of storage element write units, the semiconductor device may further include an overall control circuit configured to control the plurality of storage element write units, each of the plurality of storage element write units may include a latch circuit configured to store information on whether to perform a write to the storage element write unit or not, and the overall control circuit may include a circuit configured to output a logical sum or a logical multiplication of outputs of either fourth node signals of the plurality of storage element write units or third node signals of the plurality of storage element write units, in the semiconductor divide of the eight aspect.

In the semiconductor device according to a tenth aspect of the present disclosure, the storage element write unit may include a plurality of storage element write units, the semiconductor device may further include an overall control circuit configured to control the plurality of storage element write units, each of the plurality of storage element write units may include a latch circuit configured to store information on whether to perform a write to the storage element write unit or not, and a circuit configured to output a logical sum or a logical multiplication of either the fourth node signal or the third node signal of the own storage element write unit and either the fourth node signal or the third node signal of the storage unit write cell at a preceding stage, and an output signal of a logical sum or a logical multiplication of either the fourth node signal of the storage element write unit at a final stage or the third node signal of the storage element write unit at a preceding stage may be input to the overall control circuit, in the semiconductor divide of the eighth aspect.

In this aspect, a logical process is sequentially performed on each unit. Thus, even when the number of units increases, the number of wires, for example, does not increase, and the area of layout for a wiring region, for example, does not increase.

In these two aspects, the configuration the storage element write units is partially shared so that a circuit area and a layout area can be thereby reduced.

In the semiconductor device according to an eleventh aspect of the present disclosure, the power supply voltage source may be a power supply from an internal power supply generating circuit, and the semiconductor device may have a circuit configuration that controls a supply voltage of the internal power supply generating circuit such that a driving capacity of the write driver is controlled to be substantially uniform depending on situations including a temperature environment in operation, in the semiconductor divide of the first aspect.

In the semiconductor device according to a twelfth aspect of the present disclosure, the write driver may be divided into a plurality of write driver sections, and an appropriate one or more of the plurality of write driver sections may be controlled to be driven such that the write driver sections have a substantially uniform driving capacity depending on situations including a temperature environment in operation, in the semiconductor divide of the first aspect.

The semiconductor device according to a thirteenth aspect of the present disclosure is a semiconductor device employing a method for programming a plurality of fuses arranged in an array, and the semiconductor device employs a control method of applying a pulse of a write current to each selected one of the plurality of fuses and determining necessity for a next programing pulse based on a determination result of a fuse blown state after a lapse of a delay time.

In the semiconductor device according to a fourteenth aspect of the present disclosure, each selected one of the plurality of fuses may be connected to a drain of a readout and write transistor, and a potential of the connected node may be used for determining the next programing pulse, in the semiconductor divide of the thirteenth aspect.

In the semiconductor device according to a fifteenth aspect of the present disclosure, a gate of a write driver to the selected one of the plurality of fuses may be connected to a signal from a control circuit configured to determine the next programing pulse, in the semiconductor divide of the fourteenth aspect.

In the semiconductor device according to a sixteenth aspect of the present disclosure, a series of pulse time of the programing pulse may be N×delta t, where N is the number of fuses in the array, and delta t is in the range from one nanosecond to one second, in the semiconductor divide of the thirteenth aspect.

Advantages of Invention

As described in the aspects above, a write state of the storage element is stopped after a lapse of a predetermined time from detection of a blown state of the storage element. Accordingly, a stable blown state can be obtained, and a semiconductor device having a high yield and high reliability can be provided.

DESCRIPTION OF EMBODIMENTS

Embodiments of the present disclosure will be described hereinafter with reference to the drawings. The technique of the present disclosure is not limited to these embodiments, and the embodiments may be modified and/or combined as necessary within a range not departing from the range in which advantages are exhibited.

First Embodiment

Figure 1:
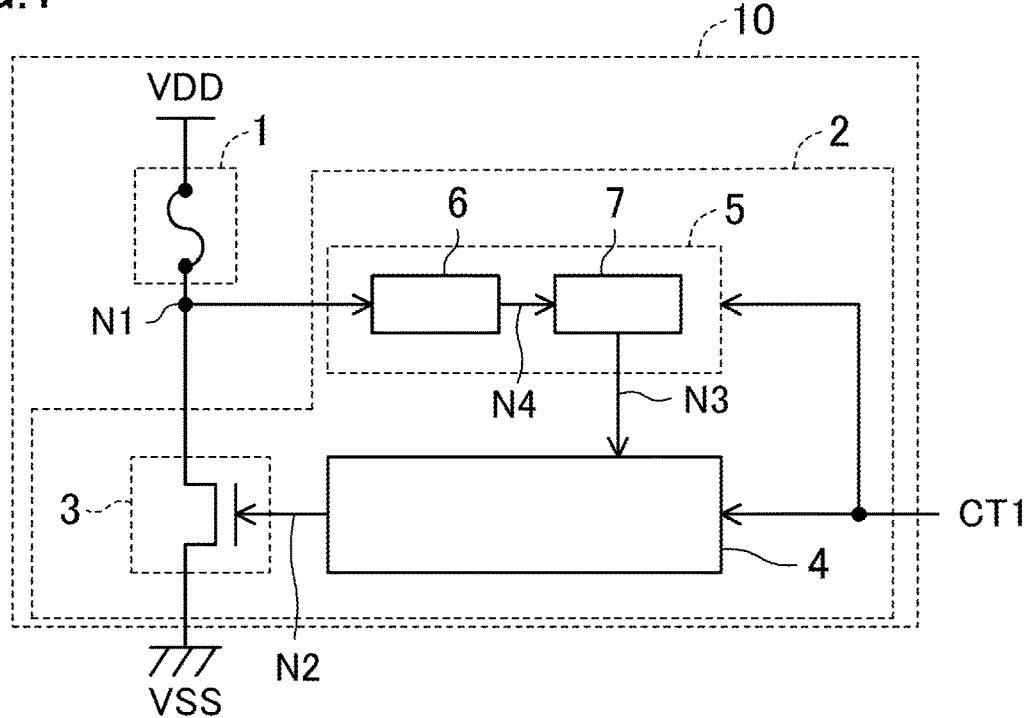
FIG. 1 A circuit diagram of a storage element write unit according to a first embodiment.
Figure 2:
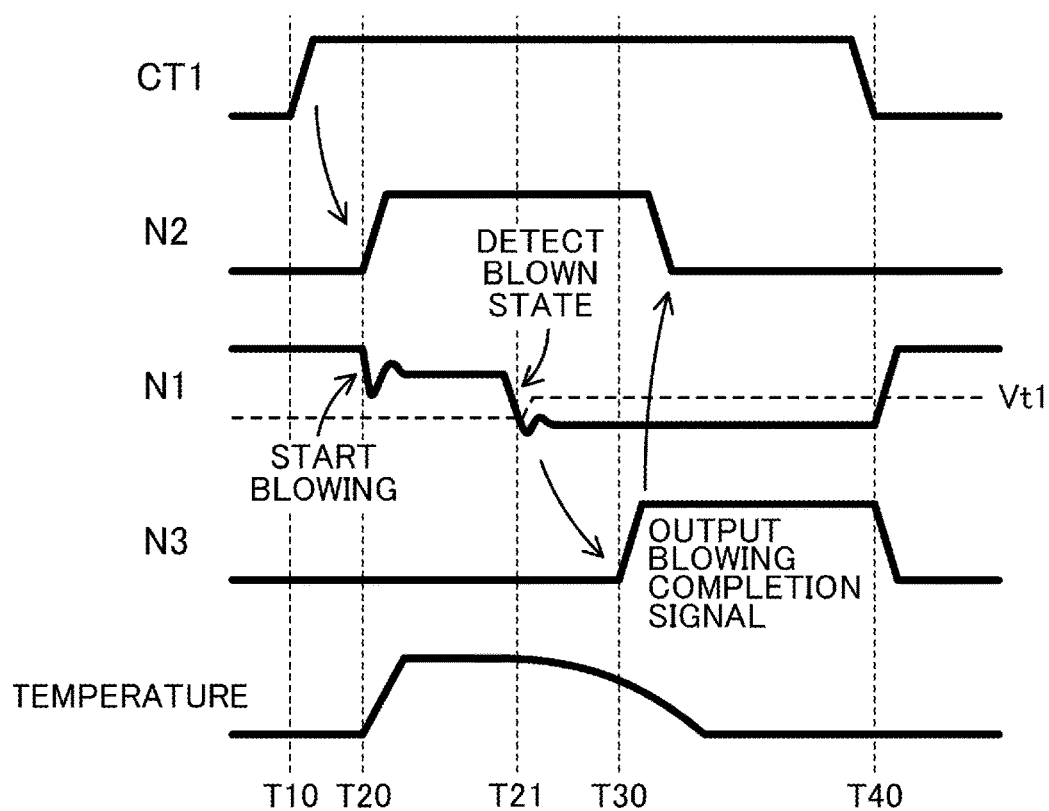
FIG. 2 A chart showing operation timings of the storage element write unit according to the first embodiment.
Figure 3:
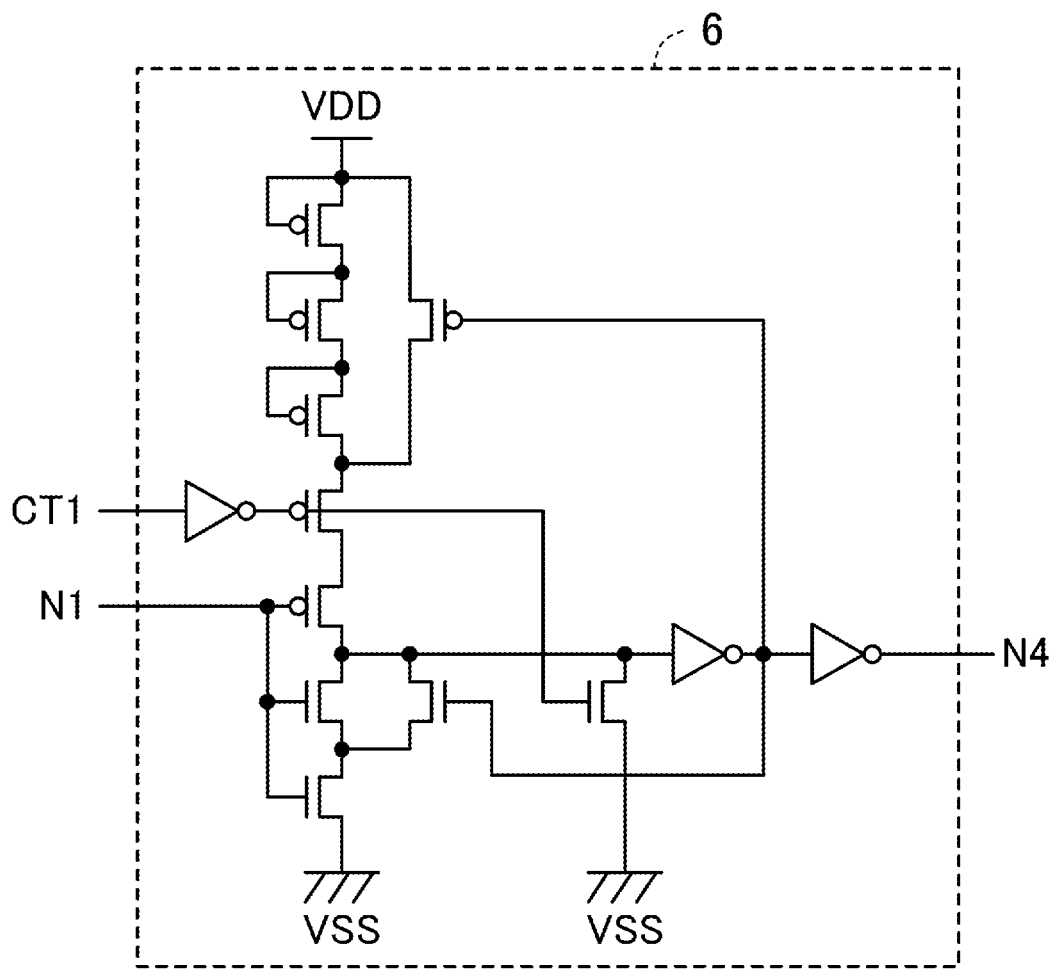
FIG. 3 A circuit diagram illustrating an example of a signal level detection circuit.
Figure 4A:
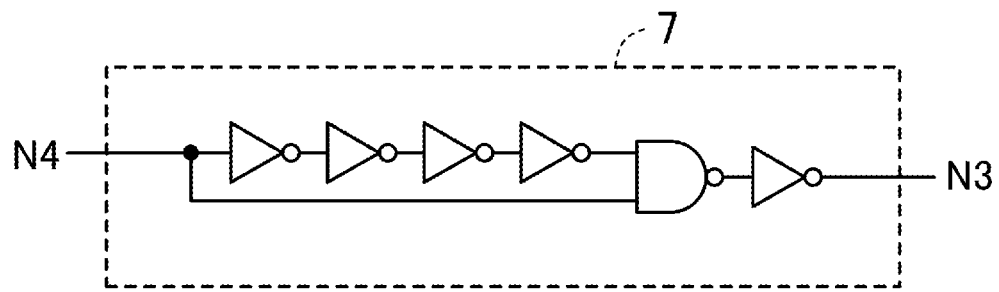
FIG. 4A A circuit diagram illustrating an example of a delay circuit.
Figure 4B:
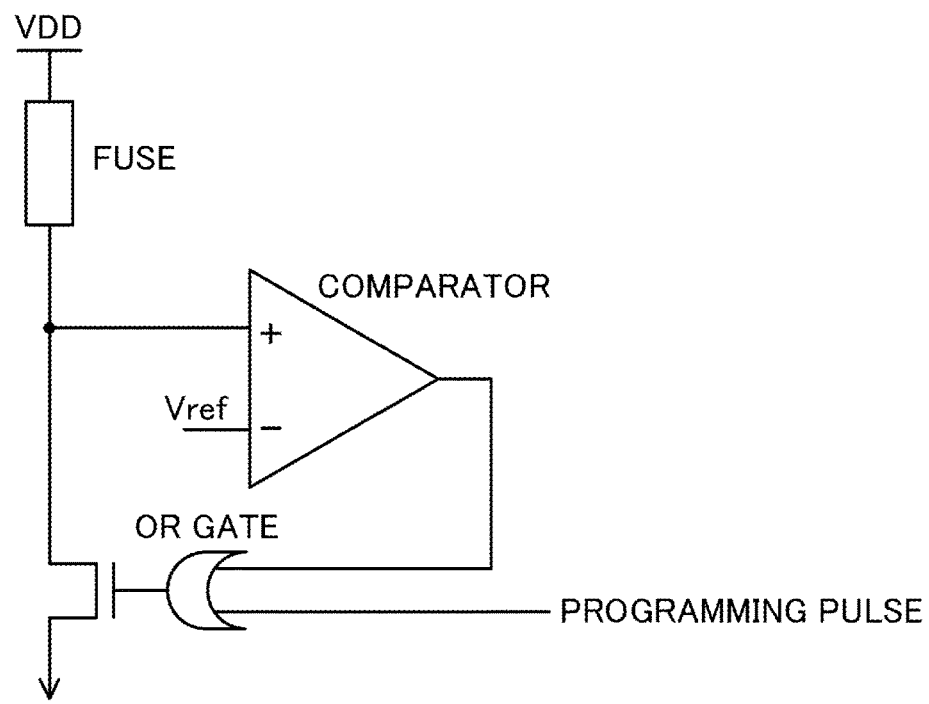
FIG. 4B A circuit diagram illustrating another example of the storage element write unit according to the first embodiment.
Figure 4C:
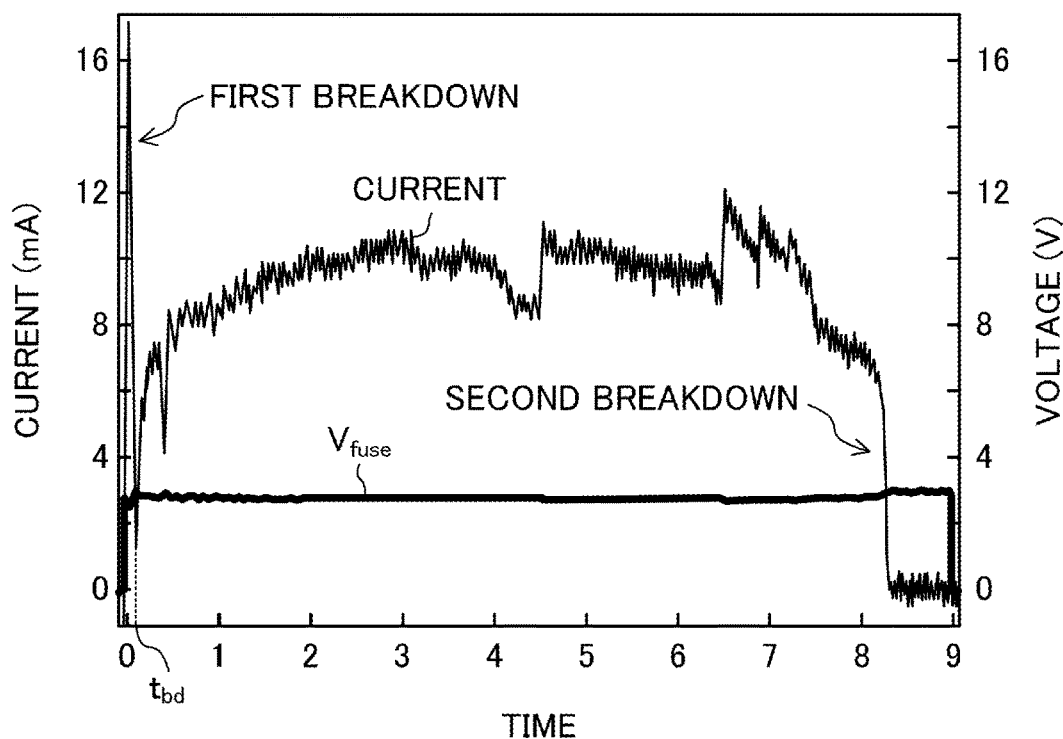
FIG. 4C A graph showing an actual current waveform of FIG. 2.

FIG. 1 is a circuit configuration view illustrating a storage element write unit 10 according to a first embodiment of the present disclosure. FIG. 2 is a chart showing operation timings of the storage element write unit 10. FIGS. 3 and 4A are an example of an embodiment of a signal level detection circuit and a delay circuit in a write state detection circuit included in FIG. 1. FIG. 4B is a circuit configuration diagram replacing FIG. 1 of the storage element write unit 10 according to the first embodiment. FIG. 4C is a graph showing an actual example illustrating a cut state of a fuse as a storage element.

With reference to FIGS. 1 and 2, a circuit configuration and operation of this embodiment will be briefly described. The storage element write unit 10 according to this embodiment includes a storage element 1 and a write controller 2, and is controlled based on a write control signal CT1. The write controller 2 includes a write driver 3, a write driver controller 4 for controlling the write driver 3, and a write state detection circuit 5. The storage element 1 is, for example, a fuse element, and the write driver 3 is an N-channel MOS transistor. The storage element 1 and the write driver 3 are connected to each other through a first node signal N1 between a power supply voltage source and a ground voltage source. The write state detection circuit 5 receives the first node signal N1 indicating whether the storage element 1 is blown or not, and outputs a third node signal N3 as a detection signal. The write driver controller 4 receives the third node signal N3 and outputs a second node signal N2. The second node signal N2 is input to the gate of a transistor of the write driver 3. The write state detection circuit 5 is constituted by a signal level detection circuit 6 and a delay circuit 7 that are connected to each other through a fourth signal node N4.

In regard to operation, the write control signal CT1 is first set at a logical level H at time T10, thereby instructing start of write operation. At time T20, the second node signal N2 reaches the logical level H, the write driver 3 turns on, and blowing of the storage element 1 starts. Then, the first node signal N1 decreases from the H level. At this time, an undershoot occurs, and after a while, the potential becomes stable. Thereafter, this state continues until the fuse is blown at time T21, and the potential of the first node signal further decreases. An undershoot also occurs at this time. This state at time T21 is detected as the fourth node signal N4 by the signal level detection circuit 6 in the write state detection circuit 5, and at time T30 through a predetermined delay time of the delay circuit 7, the state increases from the L level to the H level as the third node signal N3. In the write driver controller 4, the second node signal N2 reaches the logical level L as a blowing completion signal based on the third node signal N3, and the write driver 3 turns off so that blowing of the storage element 1 is stopped. A temperature of the fuse in this operation increases at the start of blowing, and then gradually decreases because of a decrease in current from when the fuse is blown.

In this embodiment, blowing is stopped after a lapse of a predetermined time from determination of a blown state by monitoring the first node signal at time T21. An undershoot also occurs when the potential of the first node signal further decreases at time T21, and determination is made in an insufficiently blown state. To obtain a sufficiently blown state from this insufficiently blown state, blowing is stopped based on a signal delayed in the delay circuit 7.

Accordingly, without any of insufficiently blown state and leakage due to an excessively blown state, a stable blown state in, for example, a reliability test such as readout operation as well as an initial blown state can be obtained, and determination can be correctly made. Although the blown state varies depending on voltage and temperature especially in write control, the circuit configuration of the present disclosure can obtain a stable blown state.

In a preferred circuit configuration, when the write control signal CT1 is set at the logical level H, start of blowing of the storage element 1 is instructed, and when the signal is then set at the logical level L, blowing continues until a sufficiently blown state is completed. The write driver controller 4 constitutes such a preferred circuit configuration.

Regarding the circuit diagram of FIG. 1, FIG. 3 shows a circuit example of the signal level detection circuit 6, and FIG. 4 shows a circuit example of the delay circuit 7. These circuit examples will be briefly described.

In the configuration of the signal level detection circuit 6 illustrated in FIG. 3, when the control signal CT1 reaches the logical level H, the signal level detection circuit 6 receives the first node signal N1 indicating a blown state of the fuse. This circuit configuration has hysteresis characteristics in which when the first node signal N1 decreases below a predetermined threshold (e.g., Vt1 in FIG. 2), the output signal node N4 reaches the logical level H and a threshold of the first node signal N1 increases above a predetermined threshold. In this configuration, an input threshold is provided with hysteresis characteristics such that even when the first node signal increases slightly above the final stable value after an undershoot, this state is not erroneously detected. Accordingly, the first node signal that has once reached the logical level H can be maintained at this level with stability so that stable operation can be obtained.

FIG. 4 shows a circuit for delaying a rising edge with respect to a timing when the node signal N4 detected as described above reaches the logical level H. In this example, a delay by four-stage NOT circuits is provided. This delay time can be set as appropriate in accordance with characteristics of the fuse, and thus, can be set in the range from tens of nanoseconds to hundreds of nanoseconds, for example.

Although a specific circuit example is not shown, the write driver controller 4 receives the write control signal CT1 from the outside and the third node signal N3 of the delay circuit 7, and based on these signals, outputs the second node signal N2 for controlling ON/OFF of the write driver 3.

Specifically, when the write control signal CT1 reaches the logical level H, the write driver controller 4 sets the node signal N2 at the H level and turns on the write driver 3 to thereby cause a current for blowing to flow in the fuse. Then, after a write (blowing) to the fuse is started, when the signal level detection circuit 6 in the write state detection circuit 5 detects a blown state, the write driver 3 is turned off after a lapse of a predetermined time, irrespective of the state of the write control signal CT1 so that a current flowing in the fuse is stopped, that is, write operation to the fuse is stopped. In this example, the fuse element can be constituted by high-resistance polysilicon and low-resistance polycides formed thereon. In a write (blowing) to the fuse, the low-resistance polycide is blown so that the fuse comes to have high resistance by the polysilicon. This state will be referred to as blowing of the fuse as a storage element.

In this example, the delay circuit 7 is provided in the write state detection circuit 5 as illustrated in FIG. 1, but may be provided in the write driver controller 4.

Other Examples of First Embodiment

FIG. 4B is another circuit configuration diagram of the storage element write unit 10 according to the first embodiment. In this circuit diagram, a fuse as a storage element and an N-channel MOS transistor as a write driver are connected to each other through a connection node between a supply VDD as a power supply voltage and a ground voltage. This connection node is input to a comparator for comparison with a reference voltage Vref, and an output signal thereof is fed back as a control signal of the write driver. Although a readout driver and a determination circuit are not shown in this circuit diagram, components similar to those of a readout circuit described later can be added, and a determination circuit may be provided as a separate component, and a comparator shown in this circuit diagram may be shared. Although FIG. 4B shows only one fuse unit, fuses may be formed in an array and each programmed. A pulse of a write current is applied to each selected one of the fuses, and based on a determination result of a blown state of a fuse after a lapse of a predetermined delay time, necessity of a next programing pulse is determined for control. The next programing pulse may be continuous to a future programing pulse or may be an individual pulse. In this example, it is assumed that the programing pulse is set as a continuous pulse. Application of a continuous pulse advantageously provides stable blowing because the fuse blown state is maintained in a continuous state. FIG. 4C is a graph showing an actual example of a cut state of a fuse. The abscissa represents time, and the ordinate represents a current flowing in the fuse. In this example, the fuse is temporarily in a state close to a blown state, but under the influence of, for example, heat generation, becomes a connected state again, and at a given time, becomes a cut state. In this state, blowing operation of the fuse is completed. The time shown here is an example, and can change depending on, for example, driving capacity conditions of a cut driver. Specifically, the time can be from about 1 nsec to more than 10 usec. In some situations of a fuse device, the time can be longer, such as 1 sec. In the case of providing a plurality of fuse units, a series of pulse time is N×delta t, where N is the number of fuses in an array, and delta t is set in the range from one nanosecond (ns) to one second(s).

Second Embodiment

Figure 5:
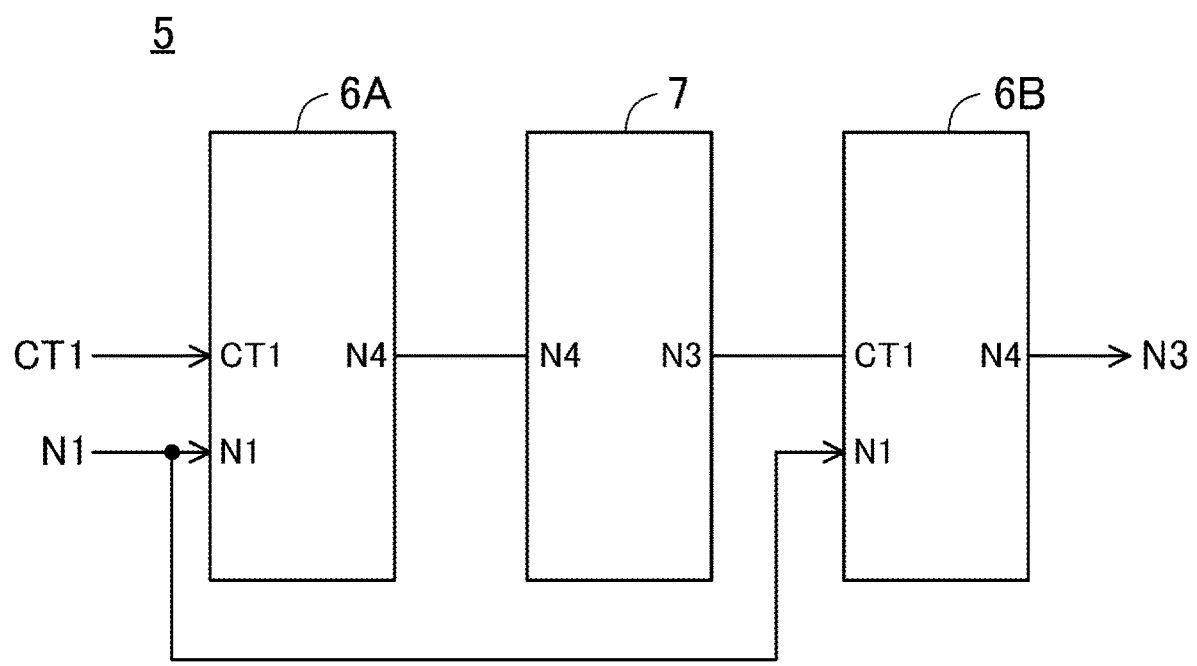
FIG. 5 A diagram illustrating a configuration example of a write state detection circuit according to a second embodiment.

FIG. 5 is a view illustrating another example of the write state detection circuit 5 as a second embodiment. Part of the configuration except for the write state detection circuit 5 is similar to that of, for example, FIG. 1.

In the write state detection circuit of FIG. 5, the delay circuit 7 is provided in a subsequent stage of a signal level detection circuit 6A, and a signal level detection circuit 6B is provided in a subsequent stage of the delay circuit 7.

In this manner, the configuration including two signal level detection circuits 6A and 6B, that is, employing a process of performing determination multiple times (twice in FIG. 5) with a delay, so that a stable blown state can be set in a fuse. Specifically, the signal level detection circuit 6A at the preceding stage determines an approximate blown state, and the signal level detection circuit 6B at the subsequent stage determines a blown state with stability after a delay of a predetermined period. Thus, stable blowing can be obtained.

The signal level detection circuit 6A and the signal level detection circuit 6B may both have a circuit configuration as illustrated in FIG. 3, or may have different circuit configurations. For example, a potential of a determination level of the signal level detection circuit 6B may be slightly higher than a potential of a determination level of the signal level detection circuit 6A. A specific method for slightly increasing a potential of a determination level is exemplified by a method of decrementing three P-channel transistors connected in series to a VDD by one obtain two P-channel transistors.

In this manner, the potential of the determination level of the signal level detection circuit 6B is set slightly higher than that of the signal level detection circuit 6A so that even in a case where the first node signal N1 has an undershoot or ringing, a determination level can be set based on a further stable state. Accordingly, it is possible to prevent or reduce an excessive increase in a period of a blown state, and a blown state of a fuse can be correctly determined.

As described above, in this embodiment, the fuse is blown as intended, and stable blowing without a reconnection state can be obtained. That is, a stable write to the fuse can be obtained. Thus, an initial blowing yield of a semiconductor device can be increased, and high reliability can be obtained.

Third Embodiment

Figure 6:
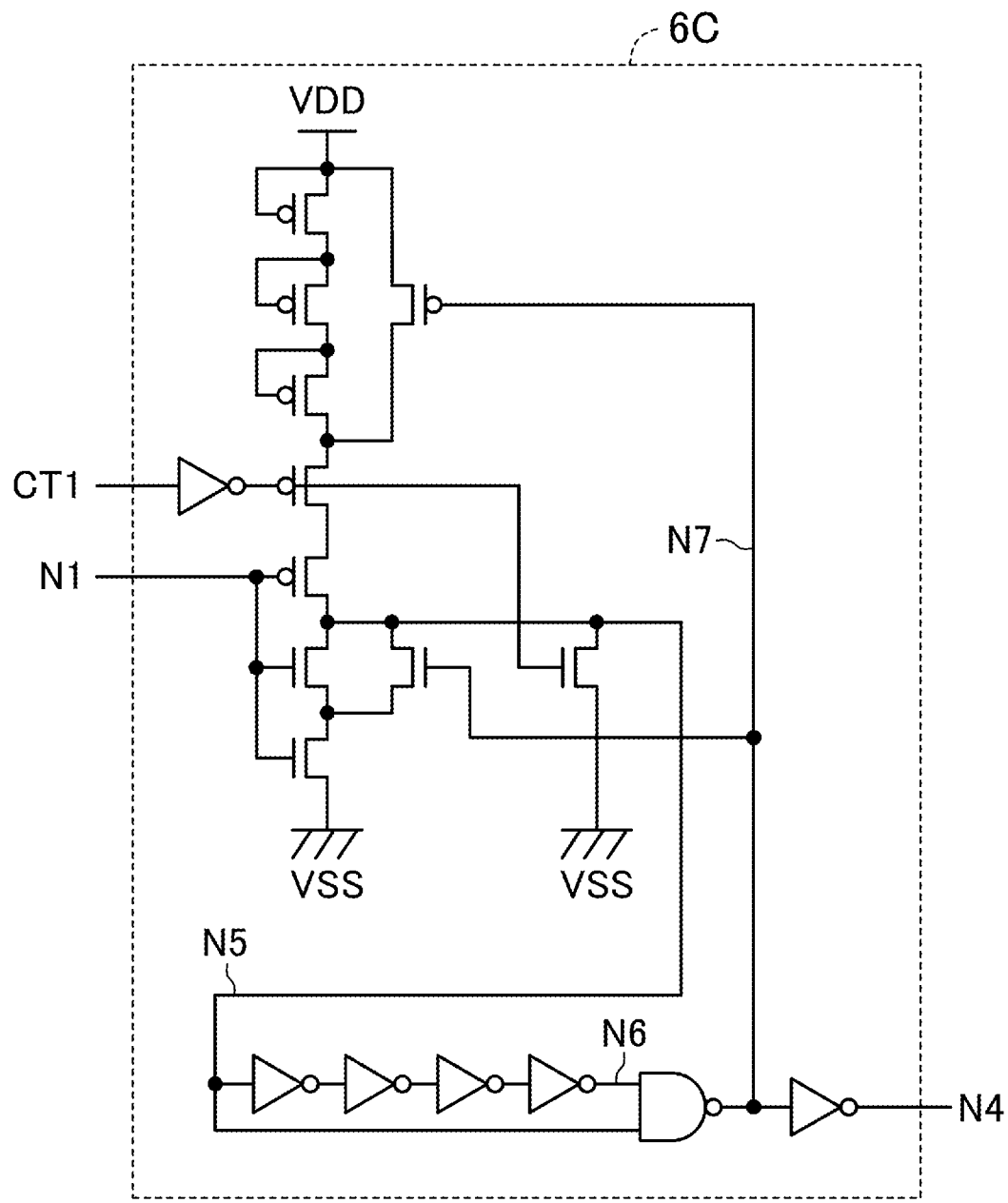
FIG. 6 A circuit diagram illustrating another configuration example of a signal level detection circuit according to a third embodiment.
Figure 7:
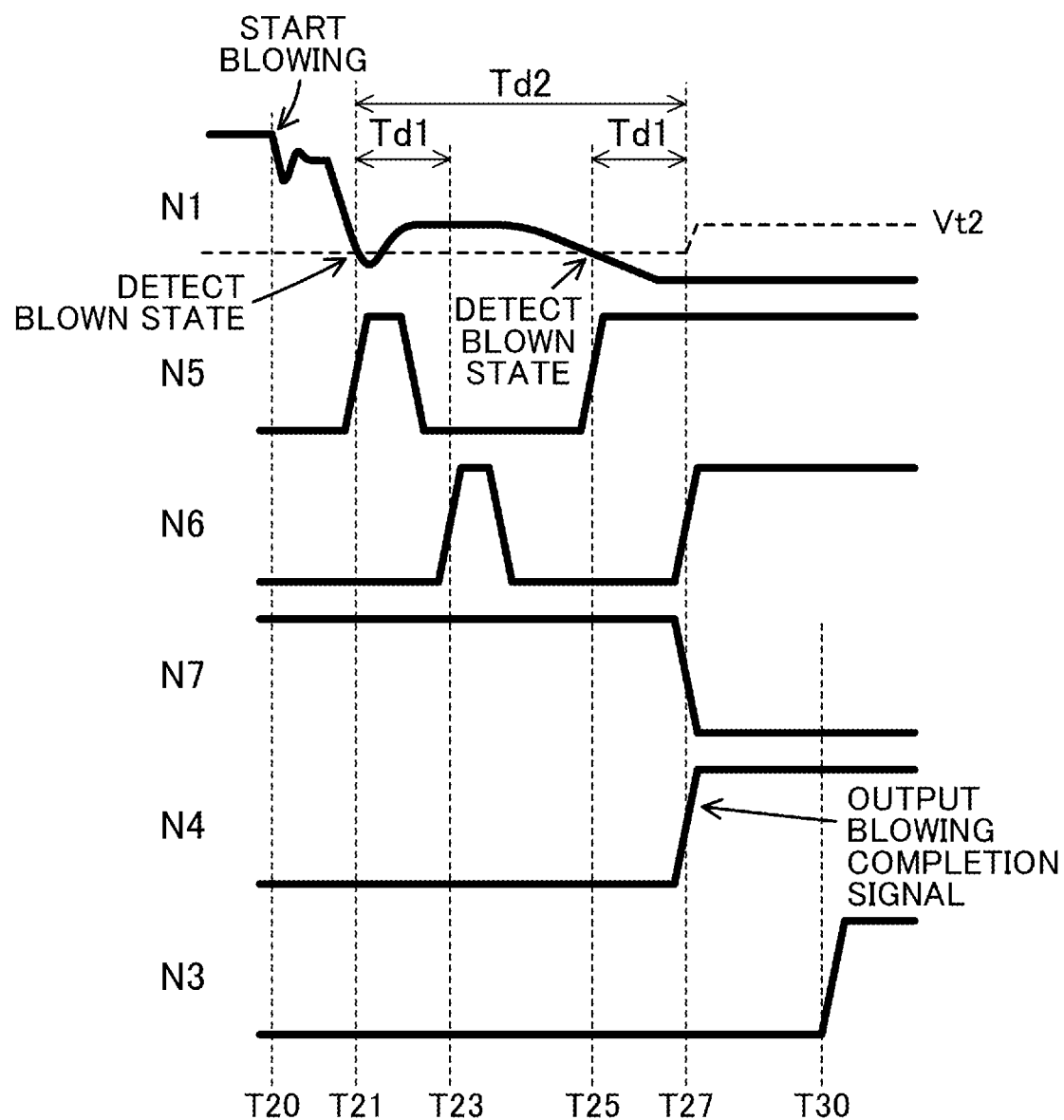
FIG. 7 A chart showing operation timings in FIG. 6.

FIG. 6 is a view illustrating another example of a signal level detection circuit 6C as a third embodiment. Part of the configuration except for the signal level detection circuit 6C may be similar to that of FIG. 1. FIG. 7 shows operation timings of the embodiment using the signal level detection circuit 6C.

As described above, the signal level detection circuit 6 illustrated FIG. 3 is configured to have hysteresis characteristics in a detection level in determining the potential of the first node signal N1. On the other hand, the signal level detection circuit 6C illustrated in FIG. 6 delays a time before the hysteresis by a given time Td1 (i.e., a delay including a delay from the node signal N5 to the node signal N6) or a time Td2. Specifically, when the blown state is detected at time T21, a blowing completion signal is output at time T23 after a given time (Td1), and a detection level is changed to high. However, since the detection level is not changed until time T23, if the potential of the first node signal N1 becomes higher than this detection level, no blowing completion signal is output. If this blown state continues and the potential of the first node signal N1 becomes lower than the detection level (T25), at time T27 after a lapse of a given time (Td1) from time T25, the fourth node signal N4 is output, and the detection level is changed to high. In this embodiment, with the circuit configuration in which noise due to an undershoot or ringing of the first node signal N1 is cancelled and the blowing completion signal is output after a lapse of a given time, erroneous determination due to an undershoot or ringing can be eliminated or reduced.

Fourth Embodiment

Figure 8:
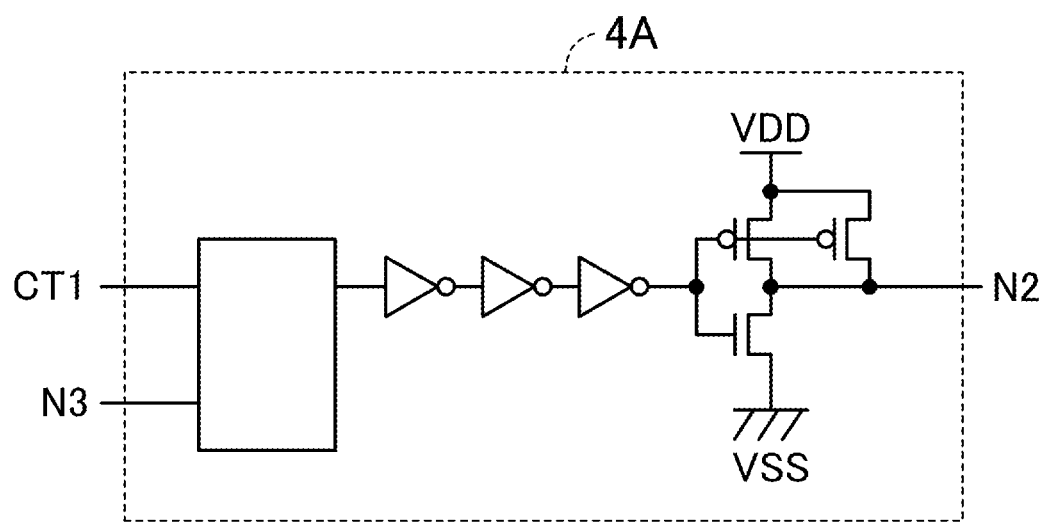
FIG. 8 A circuit diagram of a write controller according to a fourth embodiment.

FIG. 8 is a view illustrating another example of a write driver controller 4A as a fourth embodiment. Part of the configuration except for the write driver controller 4A may be similar to that of FIG. 1.

Figure 9:
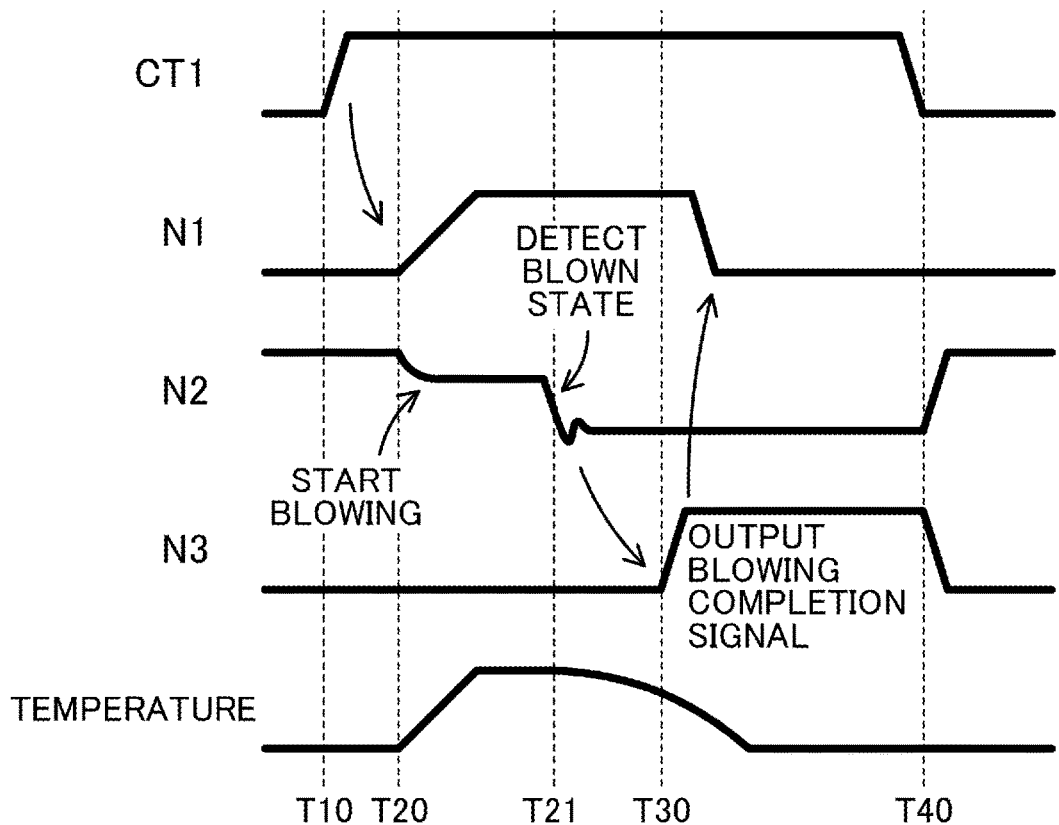
FIG. 9 A chart showing operation timings in FIG. 8.

The write driver controller 4A illustrated in FIG. 8 is configured to slowly drive a gate voltage of a write driver 3. In this circuit, a rising of a first node signal N1 is gentle, and a transition time to when the write driver 3 turns on is long. Accordingly, as shown in FIG. 9, abrupt falling of the first node signal N1 at start of blowing of a fuse can be reduced.

This circuit can prevent or reduce erroneous determination due to an undershoot of a potential of the first node signal N1, and more stable determination can be performed.

Fifth Embodiment

Figure 10:
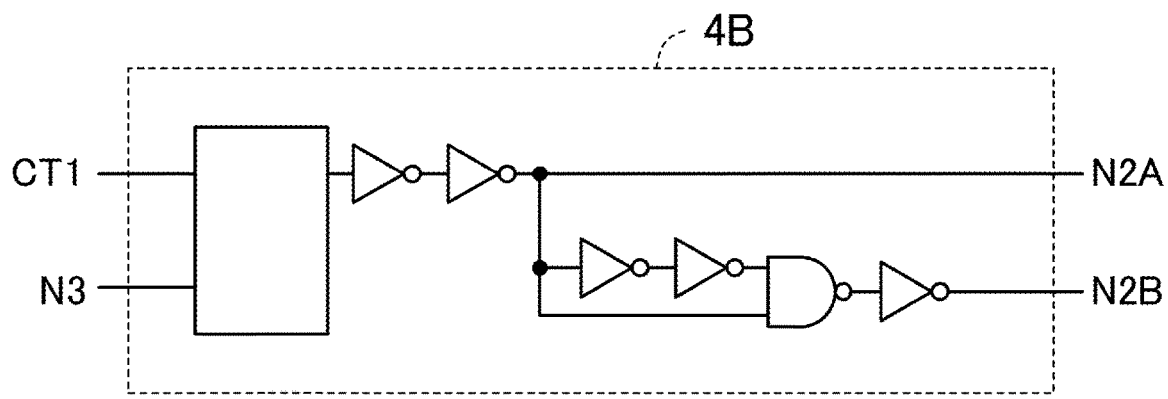
FIG. 10 A circuit diagram of a write controller according to a fifth embodiment.

FIG. 10 is a view illustrating another example of a write driver controller 4B as a fifth embodiment. Part of the configuration except for the write driver controller 4B may be similar to that of FIG. 1.

In this embodiment, although not specifically shown, a plurality of write drivers 3 are provided in parallel, and one of the write drivers 3 is first driven to have low driving capacity, and then other write drivers 3 are driven to increase driving capacity. FIG. 10 shows a circuit example of the write driver controller 4B for driving the plurality of (two in this embodiment) write drivers 3. In the write driver controller 4B illustrated in FIG. 10, a node signal N2A is first driven, and then a node signal N2B is driven.

This circuit can prevent or reduce erroneous determination due to an undershoot of a potential of the first node signal N1, and more stable determination can be performed.

Sixth Embodiment

Figure 11:
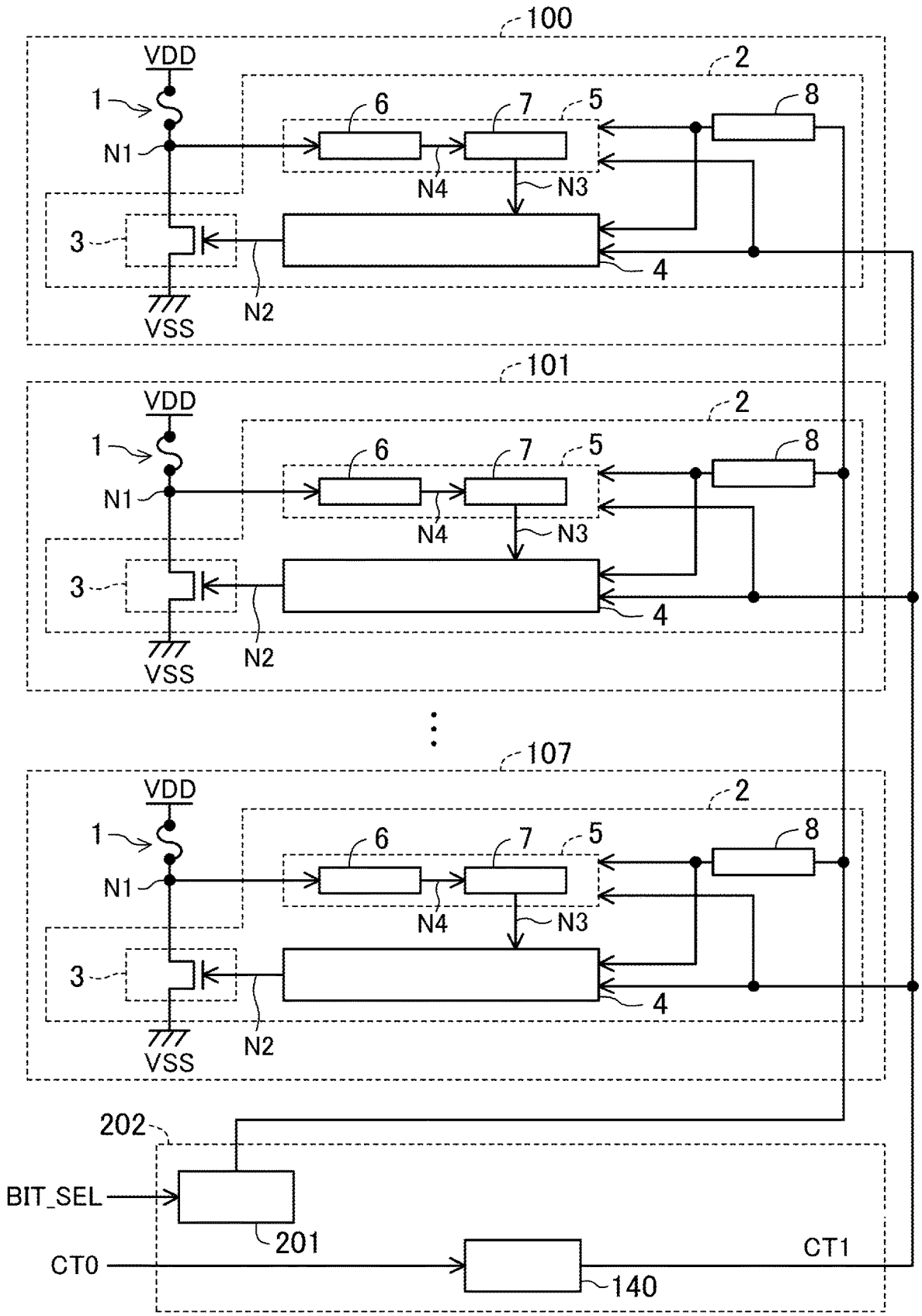
FIG. 11 A circuit diagram illustrating a configuration of a semiconductor device according to a sixth embodiment.

In the configuration illustrated in FIG. 11 as a sixth embodiment, a plurality of (e.g., eight) storage element write units for performing a write to the fuse of the first embodiment are provided in parallel. Reference numerals 100 to 107 denote storage element write units. In this embodiment, a large current is needed to blow a fuse, and thus, write blowing is performed for each block.

Each of the storage element write units 100 through 107 includes a latch circuit 8 configured to hold information indicating whether to blow each storage element or not. In this embodiment, in consideration of current consumption necessary for blowing the fuse as the storage element 1, information of performing blowing is latched only to one unit and information of performing blowing is not latched to the other units, and write blowing is performed on each block. This configuration ensures obtaining of a current necessary for blowing the fuse, and the fuse can be blown with stability. If a current excessively increases, a potential of a power supply voltage source decreases, for example, and accordingly, a current flowing in the fuse decreases and stable blowing is not easily performed. Thus, this excessive current increase is to be prevented.

A control circuit 202 for controlling the whole eight storage element write units 100 through 107 is also provided. The control circuit 202 includes an address decoding circuit 201, and based on a signal BIT_SEL, transmits information on whether to blow a fuse or not to the latch circuit 8 of each of the storage element write units 100 through 107. The signal BIT_SEL is described as a single signal name, but is a plurality of input signals for selecting a desired one block. Specifically, eight signals decoded from three signals BIT_SEL are sent to the storage element write units 100 through 107. The control circuit 202 includes a write control signal generating circuit 140 that receives an external input control signal CT0 and outputs a write control signal CT1. The external input control signal CT0 is similar to the write control signal CT1, and as described in the first embodiment, instructs start of blowing of the storage element 1. Specifically, the write driver controller in each unit perform control such that when the external input control signal CT0 is set at a logical level H, start of blowing each storage element is instructed through the write control signal CT1, and then, even at a logical level L for next write operation, blowing continues until a sufficient blown state is completed.

In this embodiment, a common circuit portion included in the eight storage element write units 100 through 107 is not provided in the control circuit 202 for controlling the whole units. However, the common circuit portion is shared so that a circuit area and a layout area can be thereby reduced.

In seventh through ninth embodiments described below, a part of the configuration of the storage element write units 100 through 107 is shared so that a circuit area and a layout area are reduced.

Seventh Embodiment

Figure 12:
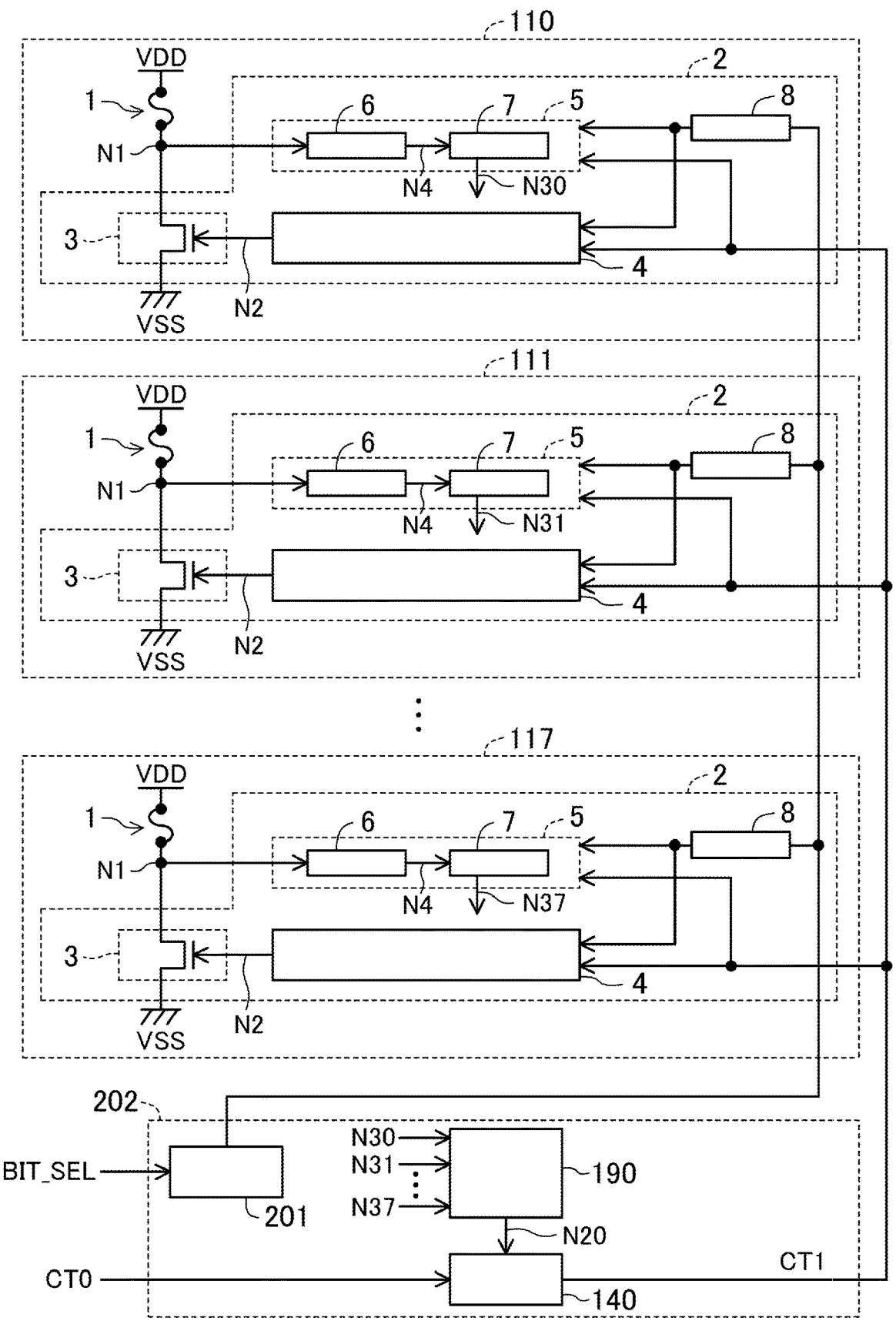
FIG. 12 A circuit diagram illustrating a configuration of a semiconductor device according to a seventh embodiment.

As illustrated in FIG. 12, in the seventh embodiment, in a manner similar to the sixth embodiment, eight storage element write units 110 through 117 for performing a write to a fuse are provided, and a control circuit 202 controls the entire storage element write units 110 through 117. In a manner similar to the sixth embodiment, an address decoding circuit 201 transmits information on whether to blow the fuse or not to a latch circuit included in each of the storage element write units 100 through 107 based on a signal BIT_SEL.

A significant difference from the sixth embodiment is that the nodes N30 through N37 of the storage element write units 100 through 107 are directly input to the write driver controller 4 in the sixth embodiment, whereas the nodes are input to a controller 190 in the control circuit 202 in the seventh embodiment. In the controller 190, a node signal N20 subjected to processing including a logical sum is input to a write control signal generating circuit 140. That is, in the sixth embodiment, the write control signal CT1 is used for transmitting start as a write control signal, whereas in the seventh embodiment, start is transmitted at a rising edge of the signal and also stop of a blown state is transmitted at a falling edge of the signal.

With this configuration, in a case where two units are in a blown state, for example, operation of, for example, stopping a blown state can be performed when both of the two units become the blown state, and the control circuit 202 for controlling the entire units can control the entire configuration so that a situation can be easily managed, for example.

Eighth Embodiment

Figure 13:
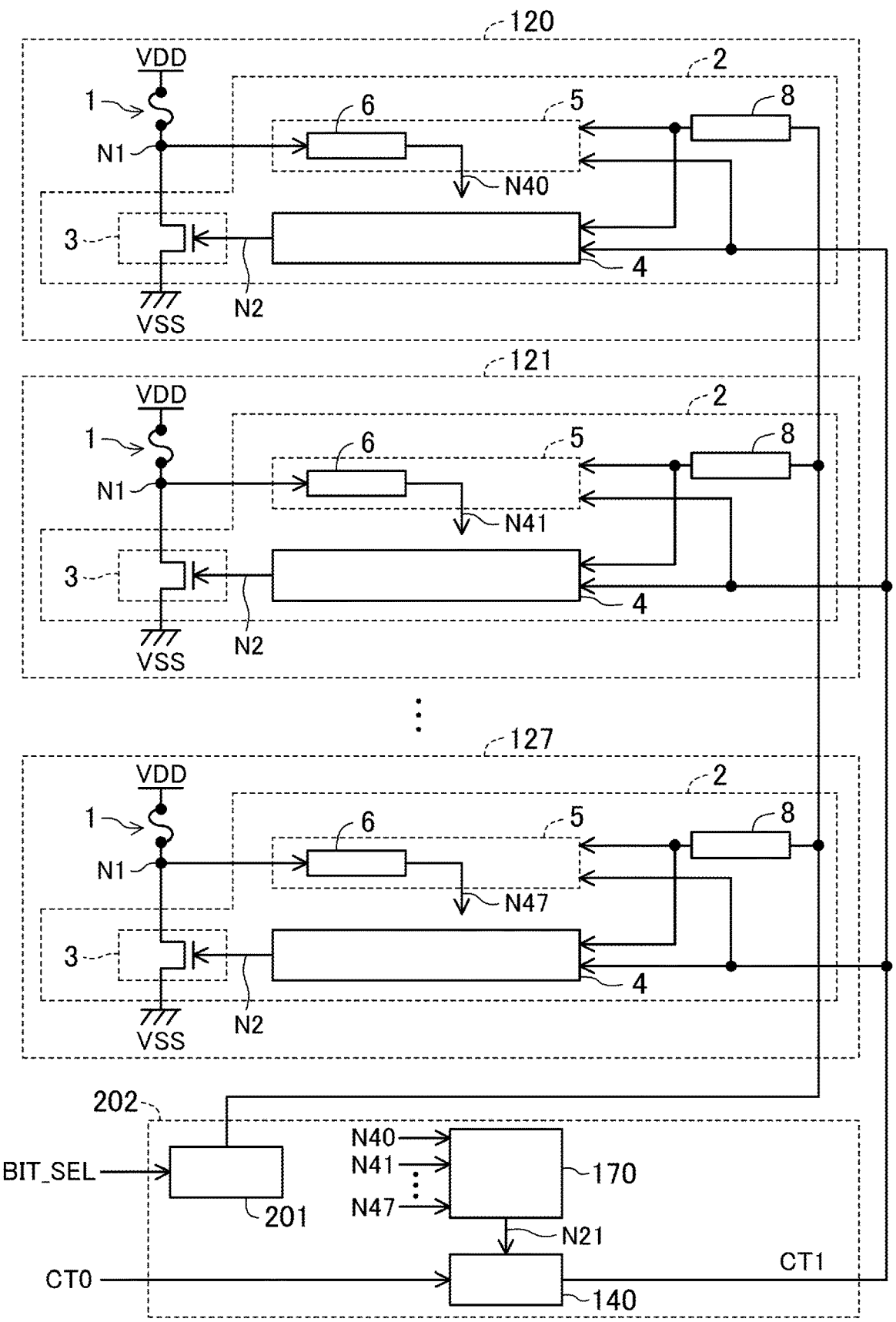
FIG. 13 A circuit diagram illustrating a configuration of a semiconductor device according to an eighth embodiment.

As illustrated in FIG. 13, in a manner similar to the seventh embodiment, in an eighth embodiment, eight storage element write units 120 through 127 for performing a write to a fuse are provided, and a control circuit 202 controls the entire storage element write units 120 through 127. In a manner similar to the embodiment described above, an address decoding circuit 201 transmits information on whether to blow the fuse or not to a latch circuit 8 included in each of the storage element write units 120 through 127 based on a signal BIT_SEL.

A significant difference from the seventh embodiment is that each of the storage element write units 110 through 117 includes the delay circuit 7 and the output node signals N30 through N37 thereof are directly input to the write driver controller 4 in the seventh embodiment. On the other hand, in the eighth embodiment, the storage element write units 120 through 127 include no delay circuits, and node signals N40 through N47 as output signals from a signal level detection circuit 6 are input to a controller 170 in the control circuit 202. In the controller 170, a node signal N21 subjected to processing including a logical sum is input to a write control signal generating circuit 140 in order to stop a write state. A delay circuit corresponding to the delay circuit 7 is shared by the controller 170 or the write control signal generating circuit 140. That is, it is sufficient that the controller 170 or the write control signal generating circuit 140 includes one delay circuit 7 disposed in each of the storage element write units in the seventh embodiment. In particular, since the delay circuit needs a large layout area, sharing the delay circuit can reduce a layout area, advantageously. In addition, since a delay time of the delay circuit can be set at one place, the same delay time can be set to any storage element write unit. In the case of adjusting the delaying time, it is sufficient to adjust one delay circuit, and processing is simple.

Ninth Embodiment

Figure 14:
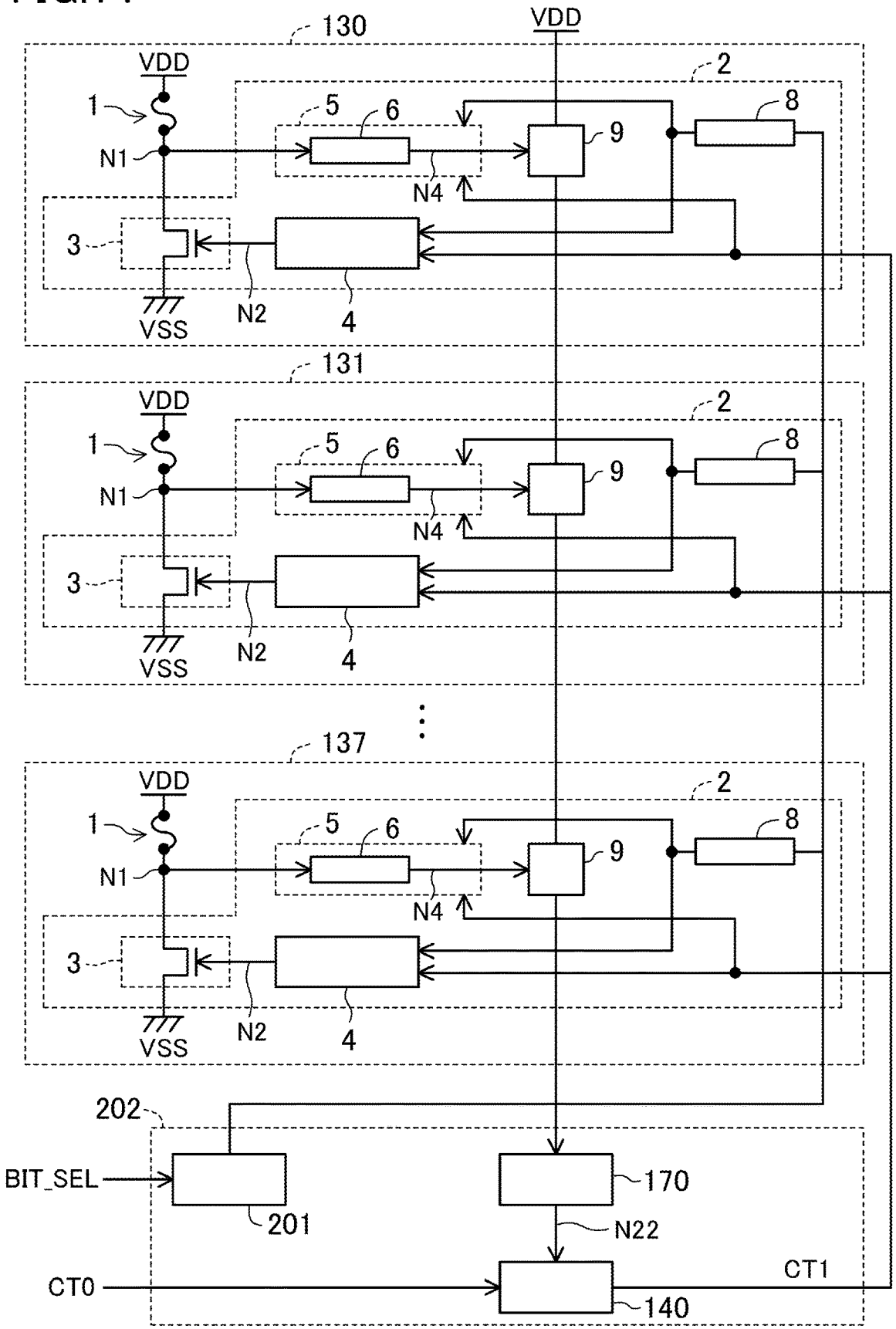
FIG. 14 A circuit diagram illustrating a configuration of a semiconductor device according to a ninth embodiment.

As illustrated in FIG. 14, in a manner similar to the eighth embodiment, eight storage element write units 130 through 137 for performing a write to a fuse are provided, and a control circuit 202 controls the entire storage element write units 130 through 137 in a ninth embodiment. In a manner similar to the embodiment described above, an address decoding circuit 201 transmits information on whether to blow the fuse or not to a latch circuit 8 included in each of the storage element write units 130 through 137 based on a signal BIT_SEL.

In the eighth embodiment, the node signals N40 through N47 of the storage element write units 120 through 127 are input to the controller 170 of the control circuit 202. On the other hand, in the ninth embodiment, in each of the storage element write units 130 through 137, a logical sum of the node signal N4 of the own storage element write unit and a fourth node signal N4 of the storage element write unit 10 at the preceding stage is transmitted to the storage element write unit 10 at the next stage.

Specifically, the storage element write unit 130 at an initial stage outputs a signal from a circuit 9 for obtaining a logical sum of a VDD signal and the fourth node signal N4, and this signal is input to the storage element write unit 131 at the next stage. The storage element write unit 131 outputs a signal from the circuit 9 for obtaining a logical sum of the output signal from the circuit 9 of the storage element write unit 130 at the preceding stage and the node signal N4 of the own storage element write unit, and this output signal is input to the storage element write unit 132 at the next stage. This process is sequentially repeated, and the storage element write unit 137 at the final stage outputs a signal from the circuit 9 (not shown) for obtaining a logical sum of an output signal from the circuit 9 of the storage element write unit 136 at the preceding stage and the node signal N4 of the own storage element write unit 137, and this output signal is input to the controller 170 of the control circuit 202. The controller 170 performs a delay process performed in the delay circuit 7 of each storage element write unit 10, and the output signal from the controller 170 is input to the write control signal generating circuit 140 through the node signal N22. The write control signal generating circuit 140 provides information for stopping the write controller to the control signal CT1.

The circuit configuration of the ninth embodiment eliminates the necessity for transmitting eight fourth node signals N4 output from the storage element write units 130 through 137 to the control circuit 202 unlike the eighth embodiment, and only one signal obtaining a logical sum between the storage element write units 10 can be input to the control circuit 202. Thus, eight signals can be replaced by one signal. The ninth embodiment shows an example in which the storage element write units 130 through 137 are eight blocks. With this configuration, even if the number of blocks is increased, the number of signal lines does not increase, and the number of signals can be reduced and the layout area can be reduced.

Tenth Embodiment

Figure 15:
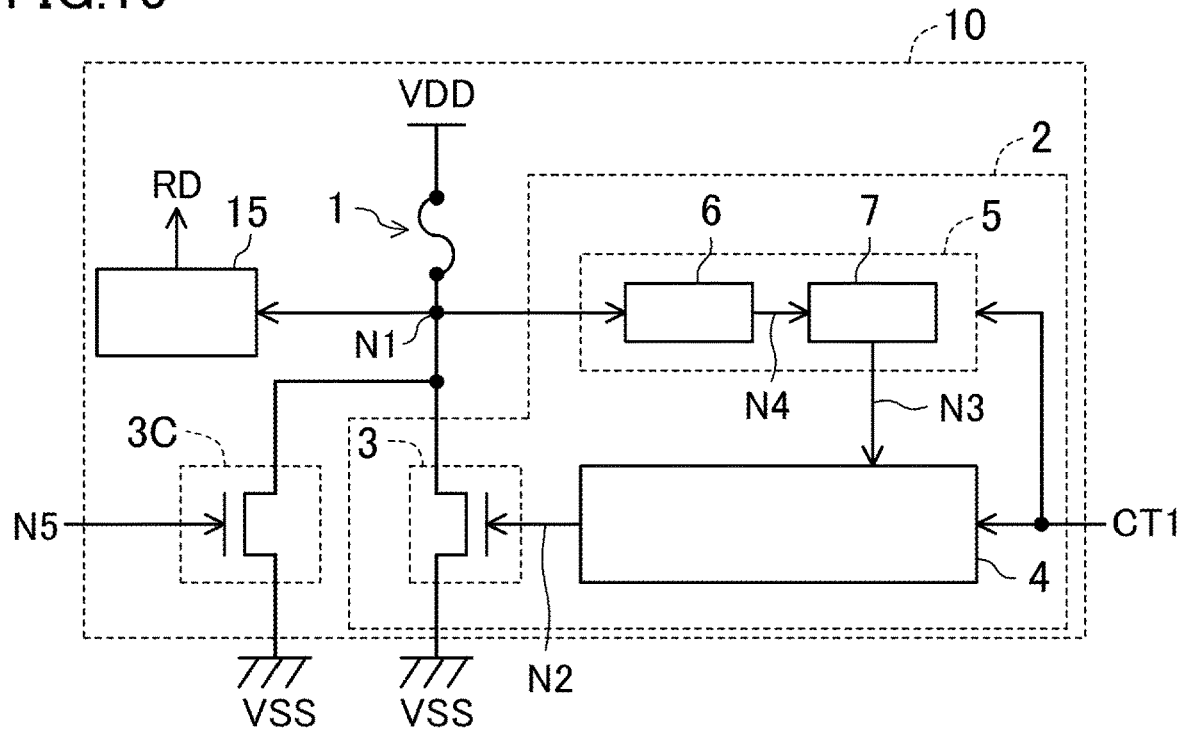
FIG. 15 A circuit diagram illustrating a configuration of a semiconductor device including a readout circuit according to a tenth embodiment.

In a tenth embodiment, as illustrated in FIG. 15 for the first embodiment, a readout circuit 15 of a fuse is provided and read data RD is output. Although not shown in detail, the readout circuit 15 may compare a comparison reference potential and a potential of a first node signal N1 or may have a circuit configuration for detecting the potential level of the first node signal N1 (e.g., a circuit configuration similar to that of the signal level detection circuit 6). A driver for falling the first node signal N1 in reading needs to be driven by a driver having lower driving capacity than that in writing such that an unblown fuse is not blown by a large current. This configuration can be implemented by setting a gate voltage of a transistor of the driver at a low voltage. However, the tenth embodiment uses a driver 3C having low driving capacity prepared in addition to the write driver 3.

In the tenth embodiment, the readout circuit 15 of the fuse is provided as a separate member from the write controller 2. Alternatively, as in an eleventh embodiment below, the readout circuit 15 and the write controller 2 may be integrally configured.

Eleventh Embodiment

Figure 16:
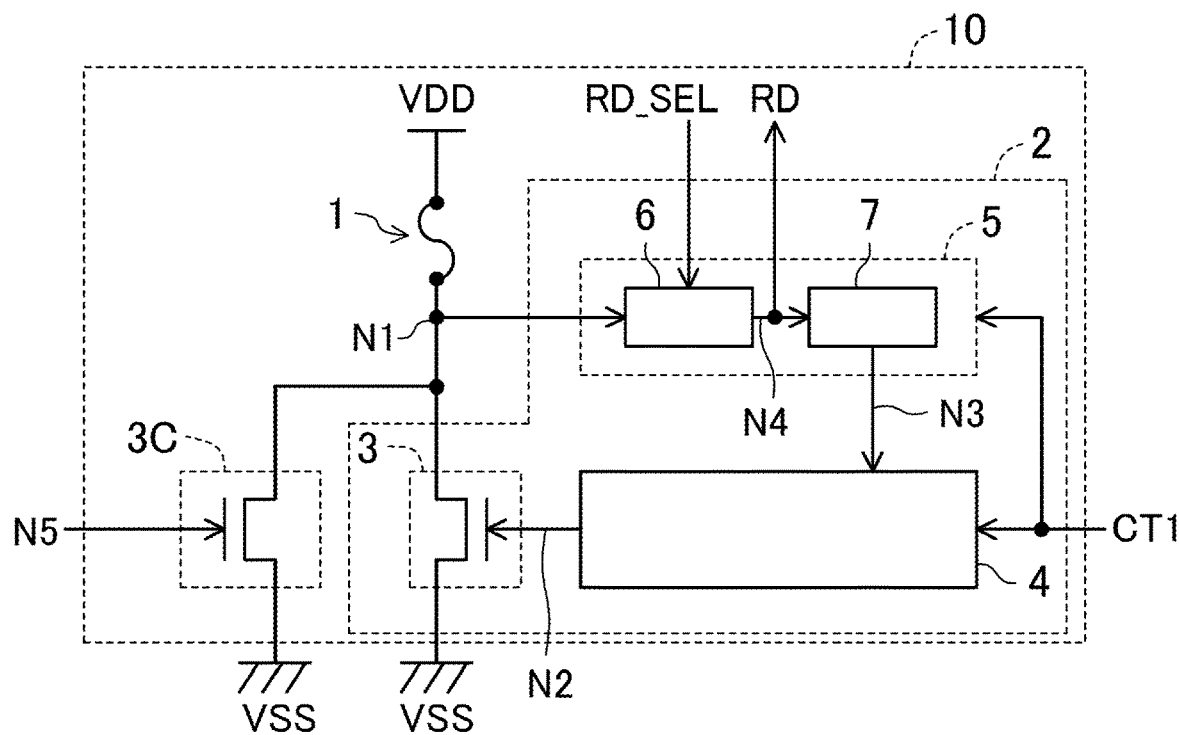
FIG. 16 A circuit diagram illustrating a configuration of a semiconductor device including a readout circuit according to an eleventh embodiment.
Figure 17:
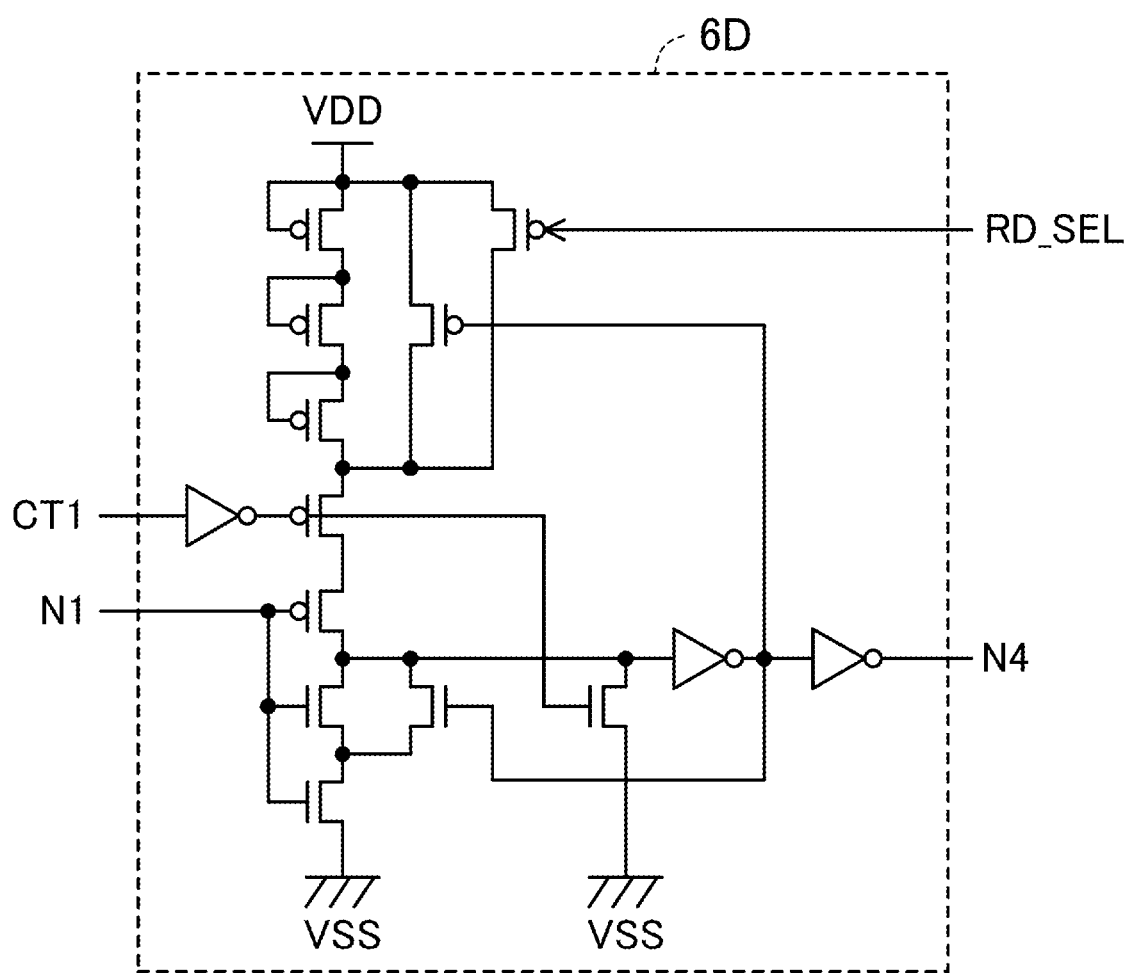
FIG. 17 A diagram illustrating a configuration example of a write state detection circuit and a readout circuit according to the eleventh embodiment.
Figure 18:
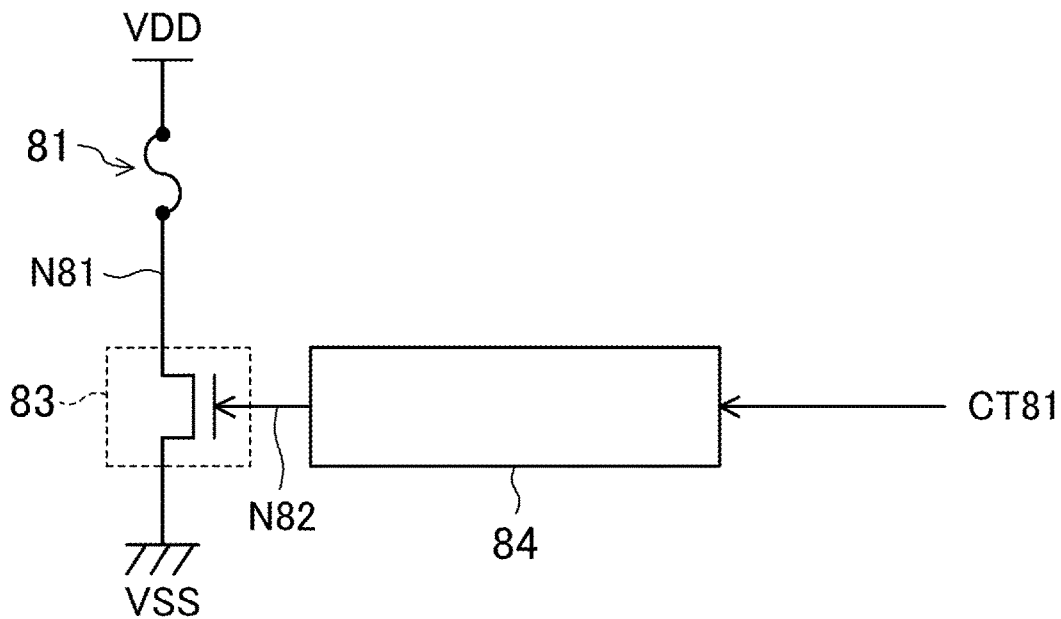
FIG. 18 A circuit diagram for describing problems in a known technique.
Figure 19:
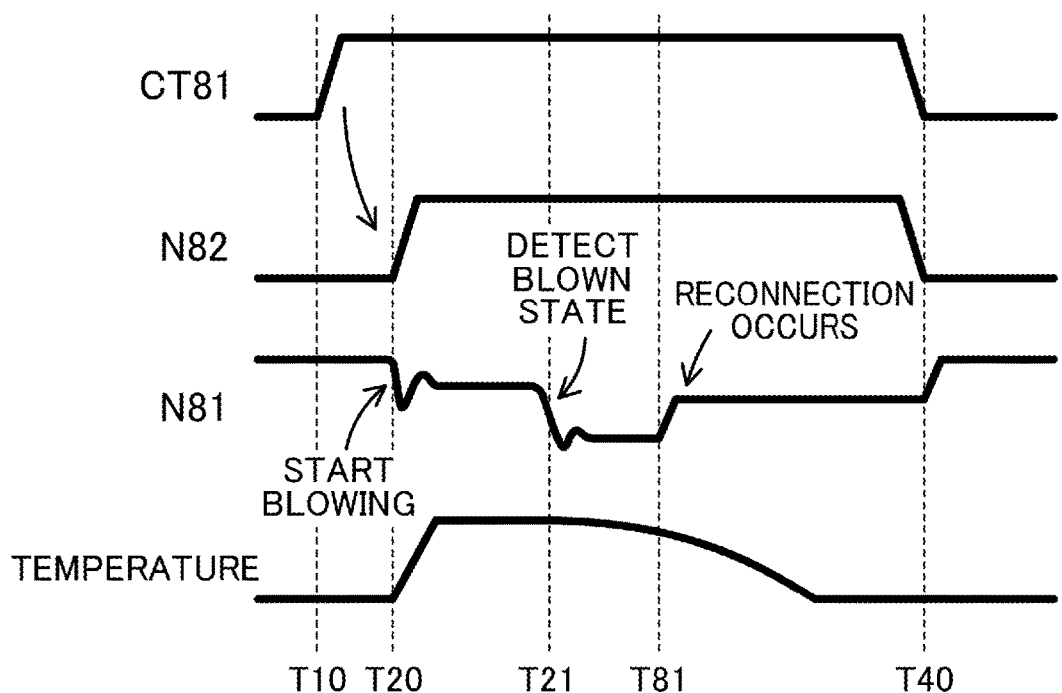
FIG. 19 A chart showing operation timings in a comparative example of FIG. 18.

In an eleventh embodiment, as illustrated in FIG. 16, a signal level detection circuit 6 is partially shared to perform a readout from a fuse. As a specific example, as in a signal level detection circuit 6D illustrated in FIG. 17, a potential determination level of a first node signal N1 is changed and used in a readout based on a selector signal RD_SEL.

The configuration of this embodiment eliminates the necessity for providing a dedicated readout circuit, and the signal level detection circuit 6 used in writing can be partially shared. Thus, a circuit area and a layout area can be reduced.

Twelfth Embodiment

In a twelfth embodiment, a fuse can be blown more safely. In the foregoing embodiments, the power supply voltage VDD is assumed to be an external power supply. On the other hand, in the twelfth embodiment, energy for blowing a fuse and a time necessary for the blowing can be appropriately set. Specifically, in a case where a VDD is a power supply from an internal voltage generating circuit and a capacity of a write driver is expected to decrease because of, for example, high temperature, the circuit is configured to increase a VDD voltage to enhance a driving capacity. This circuit configuration can enhance stability in blowing a fuse, and a blowing time can be stabilized. In the method of this embodiment, the voltage of the internal voltage generating circuit is changed and a voltage source to which the fuse is connected is also changed. Alternatively, a control method of changing a gate voltage of a write driver may be employed.

Thirteenth Embodiment

In a thirteenth embodiment, in a manner similar to the twelfth embodiment, a fuse is blown more stably. In the thirteenth embodiment, a circuit has the function of changing a driving capacity of a write driver. Specifically, the circuit has the function of selecting one of a plurality of write drivers with different driving capacities. For example, in the case of a low driving capacity of a transistor under a high temperature, some of the drivers with different driving capacities are operated, or write drivers having high driving capacities are driven. This circuit configuration can enhance stability in blowing a fuse, and a blowing time can be stabilized.

INDUSTRIAL APPLICABILITY

The technique disclosed here is useful for obtaining stable write operation to a storage element.

DESCRIPTION OF REFERENCE CHARACTERS

1 storage element
2 write controller
3 write driver
4 write driver controller
5 write state detection circuit
6 signal level detection circuit
7 delay circuit
8 latch circuit for storing information on whether to perform write to own unit
9 circuit for outputting logical sum or logical multiplication of detection signal from write state detection circuit of own unit and detection signal from preceding-stage write state detection circuit
10, 100 through 137 storage element write unit
140 write control signal generating circuit
170 controller
190 controller
201 address decoding circuit
202 control circuit for controlling entire storage element write units
N1 first node signal
N2 second node signal
N3 third node signal
N4 fourth node signal
N5 fifth node signal
CT0 entire write control signal
CT1 write control signal
VSS ground voltage source
VDD power supply voltage source
3C readout driver
15 readout circuit

The invention claimed is:

1. A semiconductor device comprising a storage element write unit, wherein
the storage element write unit is constituted by a storage element and a write controller, the storage element being configured to be electrically written only once, the write controller being configured to perform a write to the storage element,
the write controller is controlled based on a write control signal, and is constituted by a write driver, a write driver controller, and a write state detection circuit,
the storage element and the write driver are connected to each other through a first node signal between a power supply voltage source and a ground voltage source,
a second node signal that is an output from the write driver controller is input to the write driver,
the write state detection circuit outputs a third node signal as a detection signal, the third node signal being input to the write driver controller,
the write state detection circuit includes a signal level detection circuit, the first node signal being input to the signal level detection circuit, the signal level detection circuit being configured to output a fourth node signal, the third node signal being output as an output from the fourth node signal, and
in a case where a blown state of the storage element is detected based on the first node signal for detecting a write state of the storage element after start of a write to the storage element, write operation to the storage element is stopped after a lapse of a predetermined time from detection of the blown state.

2. The semiconductor device according to claim 1, further comprising a delay circuit configured to set the predetermined time in at least one of the write driver controller or the write state detection circuit.

3. The semiconductor device according to claim 1, wherein
the write state detection circuit includes
a first determination circuit configured to determine that the storage element is in the write state based on a write control signal instructing a write to the storage element and the first node signal, and
a second determination circuit configured to determine that the storage element is in the write state based on the first node signal and a signal based on a node signal as a determination output from the first determination circuit.

4. The semiconductor device according to claim 1, wherein the signal level detection circuit is capable of detecting at least a first signal potential and a second signal potential, detects the second signal potential after a lapse of the predetermined time from detection of the first signal potential, and outputs the third node signal based on detection of the second signal potential.

5. The semiconductor device according to claim 1, wherein
the write driver is a transistor, and the write driver controller is configured to drive a gate of the transistor to an on-state and has a driving capacity less than or equal to 1/10 of a driving capacity of the write driver.

6. The semiconductor device according to claim 1, wherein
the write driver includes at least a first driver and a second driver,
the write driver controller includes a first driver control circuit configured to drive the first driver and a second driver control circuit configured to drive the second driver, and
the second driver control circuit controls driving after a lapse of a predetermined delay time from driving control by the first driver control circuit.

7. The semiconductor device according to claim 1, wherein the signal level detection circuit is capable of detecting at least a first signal potential and a third signal potential,
detection of the first signal potential is to detect a write state to the storage element, and
detection of the third signal potential is to detect determination in reading.

8. The semiconductor device according to claim 1, wherein
the storage element write unit comprises a plurality of storage element write units,
the semiconductor device further comprises an overall control circuit configured to control the plurality of storage element write units,
each of the plurality of storage element write units includes a latch circuit configured to store information on whether to perform a write to the storage element write unit or not, and
each of the plurality of storage element write units performs write operation based on a write control signal instructing the write and information of the latch circuit.

9. The semiconductor device according to claim 8, wherein
the storage element write unit comprises a plurality of storage element write units,
the semiconductor device further comprises an overall control circuit configured to control the plurality of storage element write units,
each of the plurality of storage element write units includes a latch circuit configured to store information on whether to perform a write to the storage element write unit or not, and
the overall control circuit includes a circuit configured to output a logical sum or a logical multiplication of outputs of either fourth node signals of the plurality of storage element write units or third node signals of the plurality of storage element write units.

10. The semiconductor device according to claim 8, wherein
the storage element write unit comprises a plurality of storage element write units,
the semiconductor device further comprises an overall control circuit configured to control the plurality of storage element write units,
each of the plurality of storage element write units includes a latch circuit configured to store information on whether to perform a write to the storage element write unit or not, and
a circuit configured to output a logical sum or a logical multiplication of either the fourth node signal or the third node signal of the own storage element write unit and either the fourth node signal or the third node signal of the storage unit write cell at a preceding stage, and
an output signal of a logical sum or a logical multiplication of either the fourth node signal of the storage element write unit at a final stage or the third node signal of the storage element write unit at a preceding stage is input to the overall control circuit.

11. The semiconductor device according to claim 1, wherein
the power supply voltage source is a power supply from an internal power supply generating circuit, and
the semiconductor device has a circuit configuration that controls a supply voltage of the internal power supply generating circuit such that a driving capacity of the write driver is controlled to be substantially uniform depending on situations including a temperature environment in operation.

12. The semiconductor device according to claim 1, wherein
the write driver is divided into a plurality of write driver sections, and
an appropriate one or more of the plurality of write driver sections are controlled to be driven such that the write driver sections have a substantially uniform driving capacity depending on situations including a temperature environment in operation.

13. The semiconductor device according to claim 1, wherein
in a case where a pulse of a write current for a write to the storage element is applied and a blown state of the storage element is detected, application of a next pulse to the storage element is stopped after a lapse of a predetermined time from detection of the blown state.

14. A semiconductor device employing a method for a fuse determining necessity for a next programing pulse for the fuse based on a determination result of a blown state of the fuse after a lapse of a delay time.

15. The semiconductor device according to claim 14, wherein
the fuse is connected to a drain of a readout and write transistor, and
a potential of the connected node is used for determining the next programing pulse for the fuse.

16. The semiconductor device according to claim 15, wherein a gate of a write driver to the fuse is connected to a signal from a control circuit configured to determine the next programing pulse for the fuse.

17. The semiconductor device according to claim 14, wherein the time of the programing pulse is in the range from one nanosecond to one second.

* * * * *